United States Patent [19]

Klages

[11] Patent Number: 4,610,759
[45] Date of Patent: Sep. 9, 1986

[54] ETCHING SOLUTION FOR AND METHOD OF ETCHING FERRIMAGNETIC GARNET COMPOUNDS

[75] Inventor: Claus P. Klages, Hamburg, Fed. Rep. of Germany

[73] Assignee: U.S. Philips Corporation, New York, N.Y.

[21] Appl. No.: 730,221

[22] Filed: May 3, 1985

[30] Foreign Application Priority Data

May 9, 1984 [DE] Fed. Rep. of Germany ....... 3416991

[51] Int. Cl.$^4$ .................... B44C 1/22; C03C 15/00; C03C 25/06
[52] U.S. Cl. ................................ 156/662; 156/647; 156/659.1; 156/664; 156/667; 252/79.2
[58] Field of Search ............... 252/79.1, 79.2, 142; 134/2, 3; 156/647, 659.1, 662, 664, 667; 148/175

[56] References Cited

U.S. PATENT DOCUMENTS

| | | | |
|---|---|---|---|
| 4,049,488 | 9/1977 | Tijburg | 156/662 X |
| 4,290,843 | 9/1981 | Korenstein et al. | 156/628 |
| 4,443,294 | 4/1984 | Suenaga et al. | 252/79.2 X |

Primary Examiner—William A. Powell
Attorney, Agent, or Firm—Norman N. Spain

[57] ABSTRACT

An etching solution for etching ferrimagnetic garnet compounds in which the etching solution comprises at least a strong mineral acid, for example H$_3$PO$_4$, and a reducing agent, for example one-or two-electron-donors.

9 Claims, 1 Drawing Figure

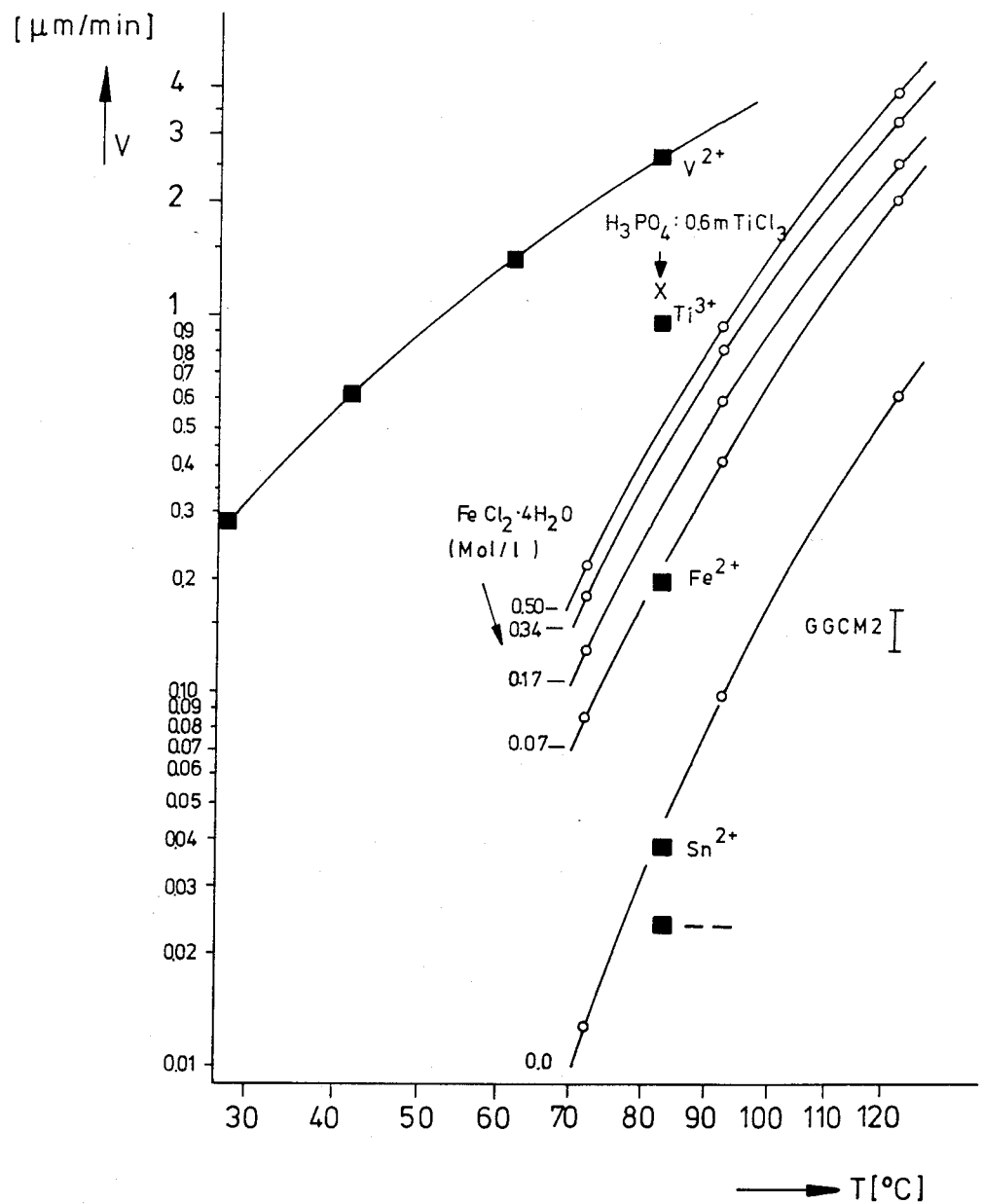

ETCHING SOLUTION FOR AND METHOD OF ETCHING FERRIMAGNETIC GARNET COMPOUNDS

The invention relates to an etching solution comprising at least one strong mineral acid for etching ferrimagnetic garnet compounds. The invention further relates to a method of etching ferrimagnetic garnet compounds.

Ferrimagnetic garnet compounds in the form of single crystal discs or layers have obtained increasing importance in the manufacture of, for example, microwave devices, bubble domain devices or magneto-optical devices. In all these applications it is required for the non-garnet single crystal surfaces to be polished by etching and/or for the single crystal surfaces to be structured photo-lithographically in certain areas; of particular interest are epitaxially produced ferrimagnetic single crystal layers on non-magnetic substrates.

As a garnet material for said purposes are used $A_3B_5O_{12}$ compounds in which (A) are rare earth metals, yttrium, bismuth or mixtures thereof and (B) are iron, aluminium, gallium, scandium, platinum or mixtures thereof. The etching rate of said materials depends on the temperature and the composition of the etching solution.

U.S. Pat. No. 3,808,068 discloses a method of etching ferrimagnetic garnet compounds in which the garnet lattice in the areas to be etched is first disturbed by ion implantation and etching is then carried out with a standard etching agent, for example $H_3PO_4$ or HCl, at a temperature of approximately 160° C.

Etching temperatures in the said temperature range first constitute a thermal load of the garnet body to be etched and, second, the step of an ion implantation to increase the etching rate is not very suitable for technical processes since it can be realized only with great investments of apparatus.

It is the object of the invention to provide an etching solution, comprising a strong mineral acid, for ferrimagnetic garnet compounds which enables etching under low thermal load at a very small technical investment.

According to the invention this object is achieved in that the etching solution comprises additionally one- or two-electron donors as a reducing agent.

As a reducing agent the etching solution advantageously comprises one- or two-electron-donors in a concentration of 0.07 to 0.6 mol/l in the form of $Fe^{2+}$, $Ti^{3+}$, $V^{2+}$, $Sn^{2+}$.

According to advantageous further embodiments of the invention the etching solution comprises as a mineral acid phosphoric acid $H_3PO_4$ or a mixture of phosphoric acid with 10% hydrochloric acid HCl in a volume ratio of 2:1.

According to an advantageous etching method with the etching solution according to the invention etching may be carried out in the temperature range from 20° C. to 120° C.

The advantages which can be achieved by means of the invention are as follows: The absolute increase of the etching rate at a given temperature, achieved by the addition of a reducing agent, permits of faster etching or structuring of iron garnet layers, which is of particular importance in the case of thick epitaxial layers (10 to 100 μm) and with materials of low etching rate. As a result of the achieved lowering of the etching temperature, the thermal load of the garnet body to be etched and hence, for example, the possibility of fracture of single crystal discs can be considerably reduced with the etching rate remaining the same.

Since only ferrimagnetic garnet compounds can be etched in an accelerated manner, hence with larger etching rate, by the etching solution according to the invention, substantially no attack of the etching solution on, for example, non-magnetic garnet substrates, for example of gallium garnet or aluminium garnet, occurs. As a result of this the rear side of a substrate single crystal disc provided on one side only with a ferrimagnetic garnet layer is substantially not attacked. In this manner etching can be carried out selectively, for example an epitaxial ferrimagnetic layer which is defective or useless for other reasons, can be removed from a non-magnetic substrate and the etched substrate can then be provided again with a layer.

A further advantage associated with the use of the etching solution according to the invention is that photolithographic structuring processes can be carried out more simply and better since the chemical and thermal load of a photolacquer mask at the possible comparatively low etching temperatures is reduced. It is then superfluous to use, for example, special masks, for example of oxides, which are otherwise required at high etching temperatures due to their better resistance vià-vis the etching solution.

Since the extent to which the etching process is accelerated by the addition of reducing agents depends on the crystallographic direction of the single crystal discs or layers to be etched, the anisotropy of the etching process can be influenced, hence for example slopes of etching structures can be influenced.

Embodiments of the invention will now be described in greater detail with reference to the drawing.

The FIGURE shows etching rates of (111)-garnet layers in strong mineral acids with and without the addition of reducing agents.

As shown in FIG. 1, etching were carried out in the temperature range of 25° to 120° C. As an iron garnet material was tested samples of epitaxial layers having a thickness of 5 to 6 μm and a composition of $(Gd,Bi,Ph)_3 (Fe,Al,Ga,Pt)_5O_{12}$. The epitaxial layers were provided on substrates of the composition $(Gd,Ca)_3 (Ga,Mg,Zr)_5O_{12}$ (GGCMZ). For determining the etching rates, samples of approximately 3 to 5 mm side length were etched in reaction glasses with vigorous magnetic stirring (300 to 500 rpm) with the following etching solutions, the time up to the disappearance of the layer being measured.

Further samples of epitaxial layers having a composition of $Y_3Fe_5O_{12}$ were investigated.

As etching solutions were used phosphoric acid (85% aqueous solution) and mixtures in the volume ratio 2:1 of phosphoric acid $H_3PO_4$ with 10% hydrochloric acid HCl, to which 0 to 0.6 mol/l of a compound of the reducing ions $Fe^{2+}$, $Ti^{3+}$, $V^{2+}$ and $Sn^{2+}$ were added, in which there was started from the following compounds:

$Fe^{2+}$: $FeCl_2.4H_2O$
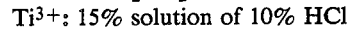
$Ti^{3+}$: 15% solution of 10% HCl
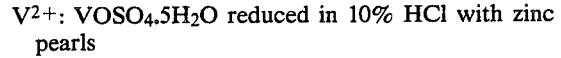
$V^{2+}$: $VOSO_4.5H_2O$ reduced in 10% HCl with zinc pearls
$Sn^{2+}$: $SnCl_2.2H_2O$.

In the Figure the etching solutions used are shown as follows: $O = H_3PO_4$ in the form of an 85% aqueous solution with additions of $FeCl_2.4H_2O$ in concentrations of 0.07 to 0.5 mol/l.

= $H_3PO_4$ + 10% HCl in the volume ratio 2:1 with additions of each time 0.33 mol/l of the reducing agent and without the addition of reducing agent.

X = $H_3PO_4$ with addition of 0.6 mol/l $TiCl_3$.

The perpendicular bar denoted by GGCMZ in the Figure shows the etching rate of a non-magnetic garnet substrate of the composition $(Gd,Ca)_3(Ga,Mg,Zr)_5O_{12}$.

As appears from the Figure, an etching process on ferrimagnetic garnet layers is accelerated considerably in the presence of $Fe^{2+}$ ions compared with an etching process without the addition of a reducing agent; at 70° an etching acceleration occurs by a factor 20, at 120° C. the etching acceleration is still larger by a factor 7. The temperature dependence of the etching rate is apparently slightly reduced by an $Fe^{2+}$ addition, where the etching rate does not increase linearly with the $Fe^{2+}$ concentration at constant temperature but seems to approach a constant value which probably is determined by the rate of a preceding or succeeding reaction.

$Ti^{3+}$ and $V^{2+}$ additions prove to be even more effective than $Fe^{2+}$ additions, while a $Sn^{2+}$ addition shows only a slight increase of the etching rate with respect to etching solutions without the addition of reducing agent. In the presence of $V^{2+}$ the etching rate is greater by approximately 2 orders of magnitude than in etching solutions without the addition of a reducing agent.

The increase of the etching rate by the addition of a reducing agent hence enables of performing an etching process at room temperature with already acceptable times.

The dissolving rate of non-iron garnets in strong mineral acids is not increased by the addition of reducing agents: the relative decrease in weight per unit of time of non-magnetic GGCMZ substrate discs in (111)-orientation is substantially independent of the concentration of $Fe^{2+}$ in $H_3PO_4$; the etching rate is at 120° C. approximately $2.5 \times 10^{-7}$ cm/s in which experiments in $H_3PO_4$ without and with the addition of $Fe^{2+}$ in concentrations up to 0.34 mol/l were carried out (compare the perpendicular bar characterized by GGCMZ in the figure).

Etching rates of (111) garnet layers in strong mineral acids with and without the addition of a reducing agent are recorded in the following table, showing examples of ferrimagnetic garnet layers, and at the end of the table, two examples of the etching of non-iron garnet substrates:

| ETCHING RATES OF (111) GARNET LAYERS IN STRONG MINERAL ACIDS WITH AND WITHOUT THE ADDITION OF REDUCING AGENT | | | | |
|---|---|---|---|---|
| Etching solution | Concentration reducing agent (mol/l) | Composition etched garnet | Etching temperature (°C.) | Etching rate (μm/min) |
| $H_3PO_4(85\%):Fe^{2+}$ | — | $(Gd,Bi,Pb)_3(Fe,Al,Ga,Pt)_5O_{12}$ | 70 | 0.013 |
| " | 0.07 | " | " | 0.087 |
| " | 0.17 | " | " | 0.130 |
| " | 0.34 | " | " | 0.18 |
| " | 0.50 | " | " | 0.22 |
| " | — | " | 90 | 0.09 |
| " | 0.07 | " | " | 0.42 |
| " | 0.17 | " | " | 0.60 |
| " | 0.34 | " | " | 0.87 |
| " | 0.50 | " | " | 0.96 |
| " | — | " | 120 | 0.63 |
| " | 0.07 | " | " | 2.06 |
| " | 0.17 | " | " | 2.59 |
| " | 0.34 | " | " | 3.40 |
| " | 0.50 | " | " | 4.01 |
| $H_3PO_4(85\%) + HCL(10\%)(2:1):V^{2+}$ | 0.33 | " | 40 | 0.63 |
| $H_3PO_4(85\%) + HCL(10\%)(2:1):V^{2+}$ | 0.33 | " | 60 | 1.41 |
| $H_3PO_4(85\%) + HCL(10\%)(2:1):V^{2+}$ | 0.33 | " | 80 | 2.70 |
| $H_3PO_4(85\%) + HCl(10\%)(2:1):Ti^{3+}$ | 0.33 | $(Gd,Bi,Pb)_3(Fe,Al,Ga,Pt)_5O_{12}$ | 70 | 0.96 |
| $H_3PO_4(85\%) + HCl(10\%)(2:1):Fe^{2+}$ | 0.33 | " | 80 | 0.20 |
| $H_3PO_4(85\%) + HCl(10\%)(2:1):Sn^{2+}$ | 0.33 | " | 80 | 0.04 |
| $H_3PO_4(85\%) Ti^{3+}$ | 0.6 | " | 80 | 1.2 |
| $H_3PO_4(85\%) + HCl(10\%)(2:1)$ | — | $(Gd,Ca)_3(Ga,Mg,Zr)_5O_{12}$ | 120 | 0.15 ± 0.02 |
| $H_3PO_4(85\%) + HCl(10\%):Fe^{2+}$ | 0.34 | " | 120 | |

What is claimed is:

1. An etching solution comprising at least one strong mineral acid for etching ferrimagnetic garnet compounds, characterized in that it comprises additionally one- or two-electron donors as a reducing agent.

2. An etching solution as claimed in claim 1, characterized in that it comprises one- or two-electron donors in a concentration of 0.07 to 0.6 mol/l.

3. An etching solution as claimed in claim 1, characterized in that it comprises $Fe^{2+}$ as a reducing agent.

4. An etching solution as claimed in claim 1, characterized in that it comprises $Ti^{3+}$ as a reducing agent.

5. An etching solution as claimed in claim 1, characterized in that it comprises $V^{2+}$ as a reducing agent.

6. An etching solution as claimed in claim 1, characterized in that it comprises $Sn^{2+}$ as a reducing agent.

7. An etching solution as claimed in claim 1, characterized in that it comprises phosphoric acid $H_3PO_4$ as a mineral acid.

8. An etching solution as claimed in claim 1, characterized in that it comprises as a mineral acid a mixture of phosphoric acid $H_3PO_4$ in the form of its 85% aqueous solution with 10% hydrochloric acid HCl in a volume ratio of 2:1.

9. A method of etching ferrimagnetic garnet compounds while using the etching solution as claimed in claim 1, characterized in that etching is carried out at an etching temperature in the range from 20° to 120° C.

* * * * *

UNITED STATES PATENT AND TRADEMARK OFFICE
CERTIFICATE OF CORRECTION

PATENT NO. : 4,610,759

DATED : Sept. 9, 1986

Page 1 of 6

INVENTOR(S) : CLAUS P. KLAGES

It is certified that error appears in the above-identified patent and that said Letters Patent is hereby corrected as shown below:

IN THE SPECIFICATION:

Column 1, line 5, insert as a centered heading

--BACKGROUND OF THE INVENTION--;

line 6, after "solution" insert --,-- (comma);

line 7, after "acid" insert --,-- (comma);

line 15, change "for" to --that--;

line 16, cancel "to";

line 17, cancel "for"; and cancel "to";

line 21, after "purposes" insert --there--;

line 22, change "(A) are " to --A represents--;

line 23, change "(B) are " to --B represents--;

line 24, change "aluminium" to --aluminum--;

UNITED STATES PATENT AND TRADEMARK OFFICE
CERTIFICATE OF CORRECTION

PATENT NO. : 4,610,759

DATED : Sept. 9, 1986

INVENTOR(S) : CLAUS P. KLAGES

Page 2 of 3

It is certified that error appears in the above-identified patent and that said Letters Patent is hereby corrected as shown below:

IN THE SPECIFICATION:

Column 1, line 25, change "said" to --these--;

line 34, change this line to --Such an etching temperature--;

line 35, change "first constitute" to --creates-- and change "of" to --for--;

line 36, cancel "second,";

line 39, change "of" to --in--;

Above line 40, insert as a centered heading --SUMMARY OF THE INVENTION--;

line 46, cancel "a"; and change "agent" to --agents--;

line 50, change "$V^{2+}$," to --$V^{2+}$ or--;

line 52, after "comprises" insert --,-- (comma);

line 53, after "acid" insert --,-- (comma);

UNITED STATES PATENT AND TRADEMARK OFFICE
CERTIFICATE OF CORRECTION

PATENT NO. : 4,610,759
DATED : Sept. 9, 1986
INVENTOR(S) : CLAUS P. KLAGES

It is certified that error appears in the above-identified patent and that said Letters Patent is hereby corrected as shown below:

IN THE SPECIFICATION:

line 58, change "may be" to --is--;

line 61, cancel "absolute";

line 63, change "permits of" to --allows the--;

line 65, after "and" insert --also--;

line 66, change "As" to --Also as--;

line 67, change "achieved" to --resultant--;

line 68, change "of" to --on--;

Column 2, line 2, after "discs" insert --,-- (comma) and change "with" to --while--;

line 3, change "remaining" to --remains--;

line 5, after "with" insert --a--;

line 6, change "according to" to --of--;

UNITED STATES PATENT AND TRADEMARK OFFICE
CERTIFICATE OF CORRECTION

PATENT NO. : 4,610,759

DATED : Sept. 9, 1986

INVENTOR(S) : CLAUS P. KLAGES

It is certified that error appears in the above-identified patent and that said Letters Patent is hereby corrected as shown below:

IN THE SPECIFICATION:

Column 2, line 7, after "invention," insert --there is--;

line 8, delete ", for example,";

line 9, change "aluminium" to --aluminum--; and delete ", occurs--;

line 11, change "disc" to --disc,--;

change "one" to --the front--;

line 17, after "a" insert --ferrimagnetic--;

line 19, change "according to" to --of--;

line 22, change "of" to --on--;

Between lines 33 and 34, insert the following:

UNITED STATES PATENT AND TRADEMARK OFFICE
CERTIFICATE OF CORRECTION

PATENT NO. : 4,610,759
DATED : Sept. 9, 1986
INVENTOR(S) : CLAUS P. KLAGES

It is certified that error appears in the above-identified patent and that said Letters Patent is hereby corrected as shown below:

IN THE SPECIFICATION:

Cont.   --BRIEF DESCRIPTION OF THE DRAWING

The sole figure in the drawing is a graph showing etching rates as a function of temperature for etching solutions containing additionally no reducing as for etching solutions of the invention containing reducing agents.

DETAILED DESCRIPTION OF THE INVENTION--;

line 36, change "The FIGURE shows" to --The sole figure of which is a graph showing--;

line 38, after "agents" insert --as a function of temperature--;

UNITED STATES PATENT AND TRADEMARK OFFICE
CERTIFICATE OF CORRECTION

PATENT NO.   : 4,610,759
DATED        : Sept. 9, 1986
INVENTOR(S)  : CLAUS P. KLAGES Page 6 of 8

It is certified that error appears in the above-identified patent and that said Letters Patent is hereby corrected as shown below:

IN THE SPECIFICATION:

line 41, cancel "was tested";

line 43, after "$(Fe,Al,Ga,Pt)_5O_{12}$" insert --were tested--;

line 50, after "the" insert --epitaxial--;

line 51, change "Further samples" to --Samples--;

line 52, after "were" insert --also--;

line 53, after "solutions" insert --there--;

line 55, change "$H_3PO_4$" to --$(H_3PO_4)$--;

line 56, change "HCL" to --(HCL))--;

UNITED STATES PATENT AND TRADEMARK OFFICE
CERTIFICATE OF CORRECTION

PATENT NO. : 4,610,759
DATED : Sept. 9, 1986
INVENTOR(S) : CLAUS P. KLAGES

It is certified that error appears in the above-identified patent and that said Letters Patent is hereby corrected as shown below:

IN THE SPECIFICATION:

lines 58 & 59, change "there was started from the following compounds" to --the reducing agents were supplied, for example, from the following compositions--;

Column 3,  line 7, after "$(Gd,Ca)_3(Ga,Mg,Zr)_5O_{12}$" insert --at a temperature of 120°C with and without the addition of a reducing agent--;

line 58, after "rate" insert --of iron garnets--;

line 59, change "hence" to --this--; cancel "of performing--;

line 60, after "process" insert --to be carried out--; change "temperature with already" to --temperatures at an--;

UNITED STATES PATENT AND TRADEMARK OFFICE
CERTIFICATE OF CORRECTION

PATENT NO. : 4,610,759

DATED : Sept. 9, 1986

INVENTOR(S) : CLAUS P. KLAGES

It is certified that error appears in the above-identified patent and that said Letters Patent is hereby corrected as shown below:

IN THE SPECIFICATION:

line 61, change "times" to --rate--;

line 62, change "non-iron" to --non-magnetic (iron-free)--.

Column 4, line 1, change "(compare" to --this is indicated by--;

line 3, delete ")";

line 8, change "non-iron" to --non-magnetic (iron-free)--;

line 45, cancel "a"; and change "agent" to --agents--.

Signed and Sealed this

Twentieth Day of January, 1987

*Attest:*

DONALD J. QUIGG

*Attesting Officer*      *Commissioner of Patents and Trademarks*